US012665590B2

(12) United States Patent
Djelassi-Tscheck et al.

(10) Patent No.: US 12,665,590 B2
(45) Date of Patent: Jun. 23, 2026

(54) INTELLIGENT SEMICONDUCTOR SWITCH WITH QUASI-DIGITAL CURRENT LIMITATION

(71) Applicant: Infineon Technologies AG, Neubiberg (DE)

(72) Inventors: Christian Djelassi-Tscheck, Villach (AT); Alexander Mayer, Treffen (AT); Mario Tripolt, Ferndorf (AT); Vincent Thiery, Aix En Provence (FR); Markus Huebl, Villach (AT); Bernhard Auer, Millstatt (AT)

(73) Assignee: Infineon Technologies AG, Neubiberg (DE)

( * ) Notice: Subject to any disclaimer, the term of this patent is extended or adjusted under 35 U.S.C. 154(b) by 261 days.

(21) Appl. No.: 18/528,469

(22) Filed: Dec. 4, 2023

(65) Prior Publication Data

US 2024/0204766 A1 Jun. 20, 2024

(30) Foreign Application Priority Data

Dec. 16, 2022 (DE) .......................... 102022133711.1

(51) Int. Cl.
*H03K 17/082* (2006.01)
*H03K 17/687* (2006.01)
(52) U.S. Cl.
CPC ....... *H03K 17/0822* (2013.01); *H03K 17/687* (2013.01); *H03K 2217/0027* (2013.01); *H03K 2217/0036* (2013.01)
(58) Field of Classification Search
CPC ............. H03K 17/0822; H03K 17/687; H03K 2217/0027; H03K 2217/0036; H03K 17/0828; H03K 17/567
See application file for complete search history.

(56) References Cited

U.S. PATENT DOCUMENTS 4,245,318 A 1/1981 Eckart et al.
4,939,347 A 7/1990 Masaka et al.
(Continued)

FOREIGN PATENT DOCUMENTS

DE 10146581 C1 4/2003
DE 102004063946 A1 3/2006
(Continued)

OTHER PUBLICATIONS

Infineon Technologies AG, "BTN8962TA High Current PN Half Bridge NovalithIC™," Data Sheet, Rev. 1.0, May 17, 2013, 26 pp.
(Continued)

*Primary Examiner* — Crystal L Hammond
*Assistant Examiner* — Samantha L Faubert
(74) *Attorney, Agent, or Firm* — Shumaker & Sieffert, P.A.

(57) ABSTRACT

A current limitation concept for an intelligent semiconductor switch is described herein. In accordance with one embodiment, a method performed by the intelligent semiconductor switch comprises generating a gate current and switching on a power transistor by applying the gate current to the gate electrode of the power transistor. The method further comprises determining information regarding a load current passing through the power transistor and controlling—based on the information regarding the load current—the load current by reducing the gate current applied to the gate electrode of the power transistor. When the load current exceeds a first threshold value, the gate current is reduced by a specific amount, and when the load current exceeds a third threshold value, the gate current is further reduced by sinking a discharge current, which has a third current level, from the gate electrode of the power transistor.

18 Claims, 4 Drawing Sheets

(56) References Cited

U.S. PATENT DOCUMENTS

| | | | |
|---|---|---|---|
| 5,517,379 A | 5/1996 | Williams et al. | |
| 5,719,509 A | 2/1998 | Chan | |
| 5,862,390 A | 1/1999 | Ranjan | |
| 5,877,647 A | 3/1999 | Vajapey et al. | |
| 6,054,845 A | 4/2000 | Feldtkeller | |
| 6,144,085 A | 11/2000 | Barker | |
| 6,166,502 A | 12/2000 | Pattok et al. | |
| 6,400,163 B1 | 6/2002 | Melcher et al. | |
| 6,924,669 B2 | 8/2005 | Itoh et al. | |
| 7,158,359 B2 * | 1/2007 | Bertele | H03K 17/0822 |
| | | | 361/93.7 |
| 7,279,765 B2 | 10/2007 | Ahn et al. | |
| 7,489,855 B2 | 2/2009 | Kraus | |
| 8,018,245 B2 | 9/2011 | Sohn | |
| 9,293,907 B2 | 3/2016 | Ueta et al. | |
| 9,413,352 B2 | 8/2016 | Lim | |
| 9,660,636 B2 * | 5/2017 | Nagase | H03K 17/0828 |
| 9,672,201 B1 | 6/2017 | Uszkoreit et al. | |
| 9,705,394 B2 | 7/2017 | Ohshima | |
| 9,887,532 B2 | 2/2018 | Djelassi et al. | |
| 9,954,548 B2 * | 4/2018 | Illing | H03M 1/367 |
| 10,170,905 B2 | 1/2019 | Illing et al. | |
| 10,305,363 B1 | 5/2019 | Chen et al. | |
| 10,868,418 B2 | 12/2020 | Djelassi-Tscheck et al. | |
| 11,018,664 B2 | 5/2021 | Bernardoni et al. | |
| 11,177,644 B2 | 11/2021 | Mayer et al. | |
| 11,271,558 B2 | 3/2022 | Djelassi-tscheck et al. | |
| 11,349,471 B2 | 5/2022 | Mayer et al. | |
| 11,404,866 B2 | 8/2022 | Illing et al. | |
| 11,405,032 B2 | 8/2022 | Bernardoni et al. | |
| 11,431,162 B2 | 8/2022 | Djelassi-tscheck et al. | |
| 11,527,881 B2 | 12/2022 | Bernardoni et al. | |
| 11,539,357 B2 | 12/2022 | Mayer et al. | |
| 11,831,302 B2 * | 11/2023 | Nakamura | H02M 1/44 |
| 2002/0024376 A1 | 2/2002 | Sander | |
| 2003/0001533 A1 | 1/2003 | Kleinau et al. | |
| 2005/0184715 A1 | 8/2005 | Kidokoro et al. | |
| 2005/0270869 A1 | 12/2005 | Krischke et al. | |
| 2006/0023383 A1 | 2/2006 | Thiery et al. | |
| 2007/0008744 A1 | 1/2007 | Heo et al. | |
| 2008/0074820 A1 | 3/2008 | Thiery | |
| 2009/0261766 A1 | 10/2009 | Lurk et al. | |
| 2011/0141643 A1 | 6/2011 | Hummel et al. | |
| 2012/0194119 A1 | 8/2012 | Kroeze et al. | |
| 2013/0082627 A1 | 4/2013 | Ichikawa et al. | |
| 2013/0301175 A1 | 11/2013 | Posat | |
| 2014/0078629 A1 | 3/2014 | Cortigiani et al. | |
| 2014/0091384 A1 | 4/2014 | Petruzzi et al. | |
| 2014/0111171 A1 * | 4/2014 | Kosugi | H02M 1/36 |
| | | | 323/271 |
| 2015/0039545 A1 | 2/2015 | Li et al. | |
| 2015/0285843 A1 | 10/2015 | Michal | |
| 2017/0063077 A1 | 3/2017 | Donath et al. | |
| 2017/0063367 A1 | 3/2017 | Tsurumaru | |
| 2017/0126227 A1 | 5/2017 | Illing et al. | |

| | | | |
|---|---|---|---|
| 2017/0294772 A1 | 10/2017 | Illing et al. | |
| 2017/0294918 A1 | 10/2017 | Illing et al. | |
| 2017/0294922 A1 | 10/2017 | Illing et al. | |
| 2017/0366116 A1 | 12/2017 | Ogawa et al. | |
| 2018/0048140 A1 | 2/2018 | Takuma et al. | |
| 2018/0248351 A1 | 8/2018 | Vail et al. | |
| 2018/0287365 A1 | 10/2018 | Djelassi-Tscheck et al. | |
| 2018/0367073 A1 | 12/2018 | Haas | |
| 2019/0052074 A1 | 2/2019 | Asam | |
| 2019/0356161 A1 | 11/2019 | Wakazono et al. | |
| 2020/0021207 A1 | 1/2020 | Donat et al. | |
| 2020/0132725 A1 | 4/2020 | Krummenacher et al. | |
| 2020/0287538 A1 * | 9/2020 | Kohama | H03K 17/0828 |
| 2021/0028615 A1 | 1/2021 | Mayer et al. | |
| 2021/0028780 A1 | 1/2021 | Mayer et al. | |
| 2021/0028781 A1 | 1/2021 | Mayer et al. | |
| 2021/0050718 A1 | 2/2021 | Djelassi-Tscheck et al. | |
| 2021/0050848 A1 | 2/2021 | Bernardoni et al. | |
| 2021/0050850 A1 | 2/2021 | Djelassi-tscheck et al. | |
| 2021/0083659 A1 | 3/2021 | Mayer et al. | |
| 2023/0375599 A1 | 11/2023 | Pidutti et al. | |

FOREIGN PATENT DOCUMENTS

| | | |
|---|---|---|
| DE | 102016100498 A1 | 7/2016 |
| DE | 102015144460 A1 | 3/2017 |
| DE | 102017107521 A1 | 10/2017 |
| DE | 102017107520 A1 | 11/2017 |
| DE | 102017107523 A1 | 11/2017 |
| DE | 102017106896 A1 | 10/2018 |
| DE | 102020100601 A1 | 7/2020 |
| DE | 102020105094 A1 | 9/2021 |
| WO | 0169784 A1 | 9/2001 |

OTHER PUBLICATIONS

International Standard ISO 26262-1, Second Edition, Dec. 2018, entitled "Road vehicles-Functional safety-Part 1: Vocabulary," 42 pp.

International Standard ISO 7637-2, Third Edition, Mar. 1, 2011, entitled "Road vehicles-Electrical disturbances from conduction and coupling-Part 2: Electrical transient conduction along supply lines only," 48 pp.

Jain et al., "Analysis and Design of Digital IIR Integrators and Differentiators Using Minimax and Pole, Zero, and Constant Optimization Methods," accepted May 2013, 15 pp.

Office Action from counterpart German Application No. 102022133711.1 dated Sep. 19, 2023, 11 pp.

Oppenheim et al., Chapter 6, Section 6.3 Basic Structures for IIR Systems, Discrete-Time Signal Processing, 2nd Edition, 1999, pp. 359-361. (Applicant points out, in accordance with MPEP 609.94(a), that the year of publication, 1999, is sufficiently earlier than the effective U.S. filing date, so that the particular month of publication is not in issue.).

* cited by examiner generating a gate current ⟋S1A switching on power transistor by applying the
gate current to the transistor's gate electrode ⟋S1B determining load current information
(current sensing) ⟋S2 controlling the load current based on the load
current information by stepwise reducing the
gate current applied to the gate electrode ⟋S3

INTELLIGENT SEMICONDUCTOR SWITCH WITH QUASI-DIGITAL CURRENT LIMITATION

This Application claims priority to German Application Number 102022133711.1, filed on Dec. 16, 2022, the entire content of which is incorporated herein by reference.

TECHNICAL FIELD

The present disclosure relates to the field of intelligent semiconductor switches and in particular to an intelligent semiconductor switch including a current limitation function.

BACKGROUND

So-called intelligent semiconductor switches are integrated circuits which include, besides the semiconductor switch as such, additional circuits that are configured to perform various auxiliary functions such as current measurement, temperature measurement, current limitation, circuit diagnosis, digital communication with other circuits, etc. Some of these auxiliary functions are implemented to protect the integrated circuit from being operated outside its safe operation area (SOA). Overcurrent switch-off and current limitation are examples of such protective functions and are a requirement for many applications.

Dependent on the electric load to be switched (e.g. light bulbs, capacitive or inductive loads different) and on the cause of an overcurrent (e.g. short circuit or high inrush currents, short transient pulses) a specific type of overcurrent protections (current limitation or temporary overcurrent switch-off) may be more suitable than others. The inventors have set themselves the object to improve existing concepts of overcurrent protection in intelligent semiconductor switches.

SUMMARY

The above-mentioned object is achieved by the circuits of claims 1 and 11 and the method of claims 14. Various embodiments and further developments are covered by the dependent claims. In accordance with one embodiment an integrated circuit comprises a power transistor connected between a supply terminal and an output terminal, a control circuit coupled to a gate electrode of the power transistor and configured to apply a gate current to the gate electrode to turn the power transistor on or off, and a current sensing circuit configured to provide information regarding a load current passing through the power transistor. The integrated circuit further comprises a current control circuit coupled to the gate electrode and configured to generate a discharge current for discharging the gate based on the information regarding the load current, wherein the level of the discharge current corresponds to a first current level, when the load current exceeds a first threshold value, and wherein the level of the discharge current corresponds to a third current level, when the load current exceeds a third threshold value.

In accordance with another embodiment an integrated circuit comprises a power transistor connected between a supply terminal and an output terminal, a control circuit coupled to a gate electrode of the power transistor and configured to apply a gate current to the gate electrode to turn the power transistor on or off, and a current sensing circuit configured to provide information regarding a load current passing through the power transistor. The integrated circuit further comprises a current control circuit coupled to the gate electrode and configured to generate a discharge current for discharging the gate based on the information regarding the load current and to cause the control circuit to reduce the gate current while the power transistor is switched on, wherein the gate current output by the control circuit is reduced, when the load current exceeds a first threshold value, and wherein the level of the discharge current is set to a third current level, when the load current exceeds a third threshold value.

A further embodiment relates to a method that may be performed by an intelligent semiconductor switch. Accordingly, the method comprises generating a gate current and switching on a power transistor by applying the gate current to the gate electrode of the power transistor. The method further comprises determining information regarding a load current passing through the power transistor and controlling—based on the information regarding the load current—the load current by reducing the gate current applied to the gate electrode of the power transistor. When the load current exceeds a first threshold value, the gate current is reduced by a specific amount, and when the load current exceeds a third threshold value, the gate current is further reduced by sinking a discharge current, which has a third current level, from the gate electrode of the power transistor.

BRIEF DESCRIPTION OF THE DRAWINGS

The embodiments described herein can be better understood with reference to the following drawings and descriptions. The components in the figures are not necessarily to scale; instead emphasis is placed upon illustrating the principles of the embodiments shown in the figures. Moreover, in the figures, like reference numerals designate corresponding parts. In the drawings.

DETAILED DESCRIPTION

Before various embodiments are described in more detail, an example of a conventional intelligent semiconductor switch (smart switch) is described with reference to FIG. 1. The example described herein relate high-side switches, which are connected between a supply voltage terminal and an electric load. However, it is understood that the concepts described herein are readily applicable to low-side switches.

Figure 1:
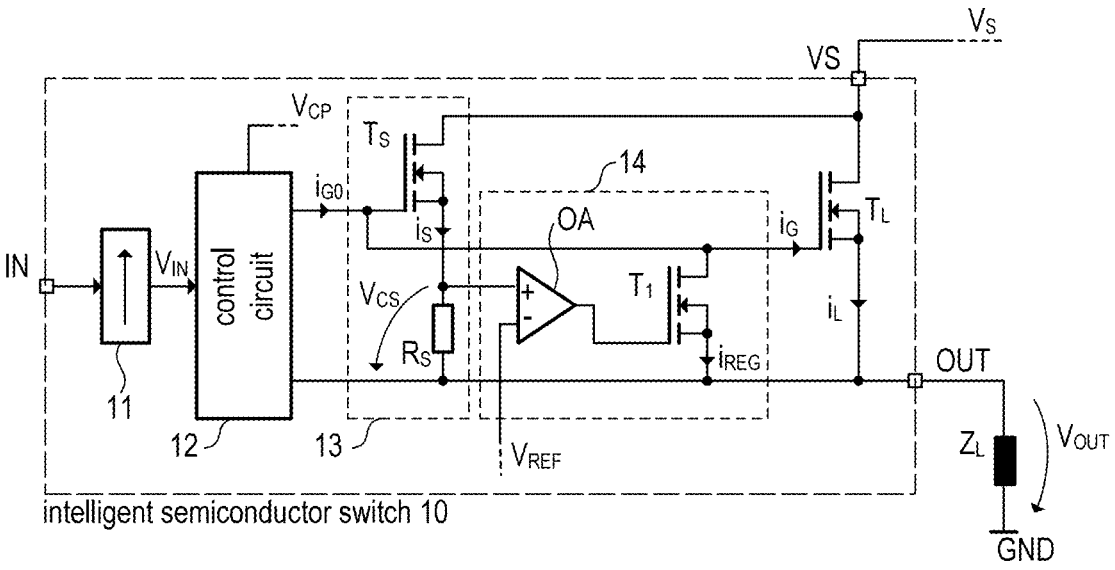
FIG. 1 illustrates one example of an intelligent semiconductor switch with a current limitation function.

In the example of FIG. 1, the intelligent semiconductor switch 10 has (inter alia) a supply terminal VS and an output terminal OUT. A power transistor $T_L$ (i.e. its load current path to be precise) can connect and disconnect the supply terminal VS and the output terminal OUT dependent on the control voltage received at its control electrode. In the present example, the power transistor $T_L$ is an n-channel MOS field-effect transistor (MOSFET) whose drain electrode is connected to the supply terminal VS and whose source electrode is connected to the output terminal OUT. In case of a MOSFET the mentioned control voltage is supplied to the gate electrode of the transistor and thus referred to as gate voltage $V_G$. In the present example, the supply voltage supplied to the supply terminal VS is denoted as $V_S$ and the electric load is symbolized by an impedance $Z_L$ that is connected between the output terminal OUT and a reference (e.g. ground) potential. The voltage across the electric load is denoted as $V_{OUT}$ (which is equal to the source voltage).

As almost any intelligent semiconductor switch, the example of FIG. 1 includes a current sense circuit 13. The current sensing is usually accomplished using a so-called Sense-FET (sense transistor $T_S$), i.e. a transistor that is operated in approximately the same operating point as the power transistor $T_L$ and therefore carries a drain-source current is which is indicative of (approximately proportional to) the load current in passing through the power transistor $T_L$. In the present example, the drain and gate electrodes of the sense transistor $T_S$ are connected to the drain and, respectively, source electrodes of the power transistor $T_L$. Further, the source electrode of the sense transistor $T_S$ is connected to the output terminal (and thus to the source electrode of the power transistor $T_L$) via a current sense resistor $R_S$. The resistance of the sense resistor $R_S$ may be quite small and its purpose is basically to convert the drain-source current is passing though the sense transistor $T_S$ into a respective voltage signal $V_{CS}$ (current sense signal). In an idealized view, the current sense signal $V_{CS}$ is proportional to the load current in passing through the power transistor $T_L$ ($V_{CS} \sim i_L$). In one example, the power transistor is composed of a plurality of transistor cells arranged in a so-called cell array, and the sense transistor is composed of a only a couple of transistor cells in the same cell array. The ratio of the transistor cells of the two transistors determines the factor of proportionality between the load current $i_L$ and the sense current is (e.g. $i_S/i_L = 10^5 = 100 \ \mu A/A$).

The example of FIG. 1 further includes a current limitation circuit 14, which can limit the load current $i_L$ so that it does not exceed a specified current limit $i_{LIM}$. In the present example, the current limit $i_{LIM}$ is determined by the (e.g. constant) reference voltage $V_{REF}$ that is used by the current limitation circuit 14. The reference voltage $V_{REF}$ is generated with respect to the electric potential of the output terminal OUT and thus is in the same voltage domain like the current sense signal $V_{CS}$. A situation $V_{CS} = V_{REF}$ indicates (in an idealized view) that the load current $i_L$ equals the current limit $i_{LIM}$ ($i_L = i_{LIM}$).

The current sense circuit 14 of FIG. 1 includes a difference amplifier OA (e.g. an operational amplifier) which receives, as input voltages, the current sense signal $V_{CS}$ and the reference voltage $V_{REF}$. The amplifier amplifies the difference $V_{CS} - V_{REF}$ with a relatively high gain. The output of the amplifier OA is coupled to the control terminal (gate terminal in case of a MOS transistor) of a transistor $T_1$ (output stage of current limitation circuit 14) that is coupled between the gate electrode and the source electrode of the power transistor $T_L$. That is, when driven into a conductive state, the transistor $T_1$ provides a current path (current $i_{REG}$) between the gate and the source of the power transistor $T_L$ for discharging its gate (thus reducing the load current). Accordingly, as long as the difference $V_{CS} - V_{REF}$ at the input of the amplifier OA is negative (i.e. $V_{CS} < V_{REF}$ and $i_L < i_{LIM}$) the amplifier OA outputs a negative voltage and the transistor $T_1$ is off (not conductive). As soon as the difference $V_{CS} - V_{REF}$ at the input of the amplifier OA becomes zero (i.e. $V_{CS} = V_{REF}$ and $i_L = i_{LIM}$) any further increase of the load current it will cause the difference $V_{CS} - V_{REF}$ to become positive. As a result, the amplifier will output a positive gate voltage to the transistor $T_1$, the transistor $T_1$ will become conductive and discharge the gate of the power transistor $T_L$, by sinking the current $i_{REG}$ which, in turn, will cause a reduction of the load current $i_L$ (and the sense current $i_S$). One can see that the transistor $T_1$, the power transistor $T_L$, the sense transistor $T_S$ and the sense resistor $R_S$ result in a negative feedback to the input of the amplifier OA, which leads to a stable state of the feedback loop and an effective current limitation to the current limit $i_{LIM}$ if the gain of the amplifier is sufficiently high.

In the above explanations concerning the current limitation, it is assumed that the power transistor $T_L$ is actively driven into an on-state. In the example of FIG. 1 a control circuit 12 generates a gate current $i_{G0}$ which is supplied to the gate of the power transistor $T_L$ (and also the gate of the sense transistor $T_S$) and charges the electrodes (i.e. gate-source capacitance). While charging the gate electrodes, the gate voltage $V_G$ rises until a maximum gate voltage is reached. A positive gate current $i_{G0}$ is only generated when a logic signal $V_{IN}$ received by the control circuit 12 indicates (e.g. by a High level) a switch-on of the power transistor $T_L$. Similarly, a negative gate current may be generated when the logic signal $V_{IN}$ indicates (e.g. by a Low level) a switch-off of the power transistor $T_L$. Suitable control circuits are as such known and thus not explained here in more detail. Usually, the control circuit includes switchable current sources that selectively provide the positive and the negative gate current $i_{G0}$ dependent on the logic level of the logic signal $V_{IN}$. The (positive or negative) gate current may be substantially constant until the current sources in the control circuit output stage saturate as the resulting gate voltage $V_G$ approaches the (upper or lower) supply voltage rail of the control circuit 12. As the current example is a High-side switch, a level shifter 11 is used to transfer the input signal received at the input terminal IN into the floating supply voltage domain of the control circuit 12. The supply voltage $V_{CP}$ of the control circuit 12 may be generated by a charge pump circuit (not shown in FIG. 1), which is as such commonly known and thus not discussed herein in more detail.

In practice the electric load it is not a single component. The wires connecting the output terminal OUT and an electric load may have a considerable impedance (e.g. in the range of a few $\mu H$). Furthermore, a (buffer) capacitor of several hundred $\mu F$ may be connected in parallel of the electric load, which may give rise to significant inrush currents when switching the on the power transistor $T_L$. Cold light bulbs also cause high inrush currents. These inrush currents may be significant (e.g. up to 80 Amperes or more) and, as a consequence, the temperature of the active area of the power transistor $T_L$, may increase very quickly. Even more critical than the absolute temperature is the temperature gradient across the semiconductor chip, which is usually measured as a temperature difference $T_J - T_A$ between the junction temperature $T_J$ in the active area of the power transistor $T_L$. (e.g. measured in the cell array) and the "ambient" temperature $T_A$ which may be measured on the same chip but remotely from the active area of the power transistor.

Some intelligent semiconductor switches have an over-temperature protection which temporarily switches the power transistor $T_L$, off upon detection of an excess temperature (e.g. the mentioned difference $T_J - T_A$ exceeding a specified threshold), and switches the power transistor $T_L$, on again once the temperature difference has dropped by a certain amount. Some intelligent semiconductor switches use an over-current switch-off instead of a pure current limitation. That is, the power transistor $T_L$ is temporarily switched off upon detection of an over-current (i.e. when the load current exceeds a specified switch-off threshold), and is again switched on a short time period later. Over-current protection and over-temperature protection may be combined in some embodiments.

The current limit used for current limitation or the over-current switch-off threshold as well as the temperature threshold used for over-temperature protection may be specified and optimized for a specific application. Usually, the circuit designer selects these parameters to ensure that the temperature (or temperature difference) of the power transistor, the temperature of the cables and/or the temperatures of other components connected to the intelligent semiconductor switch (e.g. a buffer capacitor of the load) remain within a safe range. Furthermore, non-linear effects like limit-cycles (e.g. toggling) and other instabilities have to be avoided. The embodiments discussed below aim at improving existing concepts.

Various embodiments are now described with reference to FIG. 2, which can be regarded as a modification/improvement of the example of FIG. 1. The power transistor $T_L$ and the sense transistor $T_S$ are connected in the same way as in the example of FIG. 1. Also the control circuit 12 may be connected in the same way as in the example of FIG. 1 and generated, based on the (level-shifted) input signal $V_{IN}$, a positive and negative gate current $i_{G0}$ to charge and, respectively, discharge the gate electrode of the power transistor $T_L$ in order to switch it on and off.

Different from the previous example, the current sense circuit includes a chain of three sense resistors $R_{S1}$, $R_{S2}$, and $R_{S3}$ (instead of a single sense resistor $R_S$ as in FIG. 1) which allows to provide three respective current sense signals $V_{CS1}$, $V_{CS2}$, and $V_{CS3}$. The voltage $V_{CS1}$ is the voltage drop across resistor $R_{S1}$ ($V_{CS1}=i_S \cdot R_{S1}$), the voltage $V_{CS2}$ is the voltage drop across the series connection of resistors $R_{S1}$ and $R_{S2}$ ($V_{CS2}=i_S \cdot (R_{S1}+R_{S2})$), and the voltage $V_{CS3}$ is the voltage drop across the series connection of resistors $R_{S1}$ $R_{S2}$, and $R_{S3}$ ($V_{CS3}=i_S \cdot (R_{S1}+R_{S2}+R_{S3})$). Other embodiments may use more or less current sense resistors connected in series. The intelligent semiconductor switch 10 of FIG. 2 includes a current control circuit 15 instead of the current limiting circuit 14 of FIG. 1). The current control circuit 15 receives a reference voltage $V_{REF}$ as well as the current sense signals $V_{CS1}$, $V_{CS2}$, and $V_{CS3}$, and provides—based on these current sense signals and the reference voltage—a current $i_{REG}$ at its output, which is coupled to the gate electrode of the power transistor $T_L$. A positive current $i_{REG}$ drains charge from the gate electrode of the power transistor $T_L$ (thereby reducing the gate voltage $V_G$) to reduce the load current $i_L$. The level shifter 11, the load and other components of the intelligent semiconductor switch have been omitted in FIG. 2 to keep the illustration simple. The function of the current control circuit 15 is discussed in more detail further below.

It is noted that using multiple sense resistors $R_{S1}$, $R_{S2}$, $R_{S3}$ to generate multiple current sense signals $V_{CS1}$, $V_{CS2}$, and $V_{CS3}$ is merely a way to implement multiple current thresholds $i_{LIM1}$, $i_{LIM2}$, $i_{OC}$ with only a single reference voltage $V_{REF}$. Accordingly, the situation $V_{CS3}=V_{REF}$ corresponds to the load current reaching the first threshold ($i_L=i_{LIM1}$), the situation $V_{CS2}=V_{REF}$ corresponds to the load current reaching the second threshold ($i_L=i_{LIM2}$), and the situation $V_{CS1}=V_{REF}$ corresponds to the load current reaching the third threshold ($i_L=i_{OC}$). The same result can be achieved by using a single current sense signal $V_{CS}$ and a single sense resistor $R_S$ (like in FIG. 1), when multiple reference voltages (e.g. $V_{REF1}$, $V_{REF2}$, and $V_{REF3}$) are used. Accordingly, other embodiments may have only one sense resistor but multiple reference voltage sources. Some embodiments may use only two thresholds, and some may use more than three thresholds/current limits.

Figure 3:
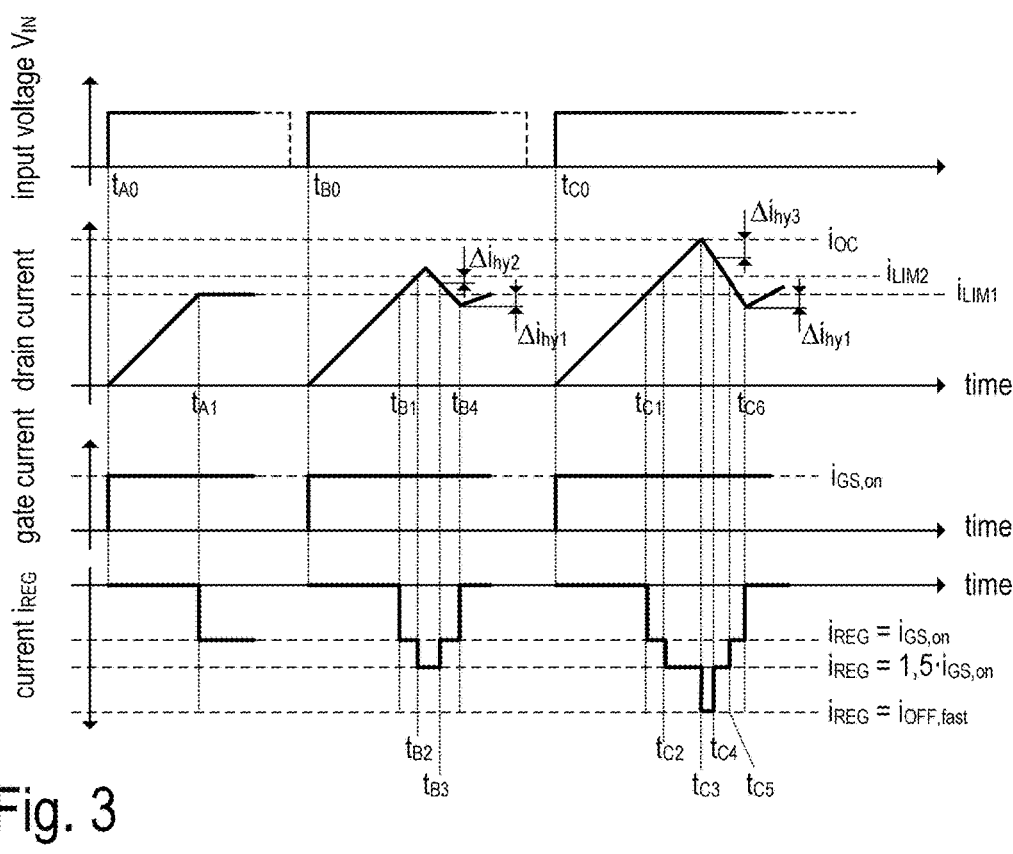
FIG. 3 includes a set of timing diagrams illustrating the function of the example of FIG. 2 in different scenarios.

The function/behavior of the current control circuit 15 is now discussed using an exemplary scenario illustrated by the timing diagrams of FIG. 3. FIG. 3 illustrates three different scenarios, in which the load current $i_L$. (drain current of power transistor $T_L$) starts to rise after the switch-on of the power transistor $T_L$ is triggered by a level transition in the input signal $V_{IN}$ from a Low level to a High Level at times $t_{A0}$, $t_{B0}$, and $t_{C0}$ (see FIG. 3, first diagram). At this point it is noted that the steepness of the slope of the load current $i_L$. (sec FIG. 3, second diagram) after a switch-on depends (inter alia) on the electric load connected to the intelligent semiconductor switch, and the target level of the load current after the switch-on phase also depends on the electric load unless the current control circuit 14 intervenes (which is the case in the depicted scenarios). Accordingly, the depicted drain current waveforms are arbitrary examples chosen to illustrate the function of the circuit of FIG. 3. As explained above, three current thresholds are used, i.e. $i_{LIM1}$, $i_{LIM2}$, and $i_{OC}$.

The third timing diagram of FIG. 3 illustrates the output of the control circuit 12, i.e. the gate current $i_G=i_{GS,on}$. As a consequence, beginning at times $t_{A0}$, $t_{B0}$, and $t_{C0}$, the gate electrode of the transistor $T_L$ is charged, the transistor $T_L$ becomes conductive, and the load current $i_L$, which is output to the load at the output terminal OUT, starts to rise. The fourth diagram of FIG. 3 illustrates the current $i_{REG}$ (discharge current) which the current control circuit 15 sinks from the gate electrode of transistor $T_L$ when the load current in hits certain thresholds.

In the first scenario (starting at time $t_{A0}$) the discharge current $i_{REG}$ is zero until the load current $i_L$ reaches the first threshold $i_{LIM1}$ at time $t_{A1}$. As soon as the load current $i_L$ of the power transistor $T_L$ reaches the threshold value $i_{LIM1}$, the current control circuit 15 sets the level of the discharge current $i_{REG}$ to a first current level. In one example, this first current level is the negative output current of the control circuit 12, i.e. $i_{REG}=i_{GS,on}$. The output current $i_{G0}=i_{GS,on}$ of the control circuit 12 and the discharge current $i_{REG}$ superpose, so that the effective gate current $i_G$ equals to difference $i_{GS,on}-i_{REG}$. In the mentioned example ($i_{REG}=i_{GS,on}$ if $i_L \geq i_{LIM1}$) the effective gate current $i_G$ is zero, and the charge stored in the gate-source capacitance slowly decreases due to leakage only. The discharge current $i_{REG}$ may be reset to zero when the load current $i_L$ drops below the threshold $i_{LIM1}$. In some embodiments, the current control circuit 15 implements a hysteresis and the discharge current $i_{REG}$ is reset to zero when the load current $i_L$ drops below the somewhat lower threshold $I_{LIM1}-\Delta i_{hy1}$ ($\Delta i_{hy1}$ denotes the width of the hysteresis). In the first scenario, setting the effective gate current $i_G$ to zero is enough to prevent the load current $i_L$ from rising beyond the threshold $i_{LIM1}$.

In the second scenario (starting at time $t_{B0}$) the discharge current $i_{REG}$ is again zero until the load current $i_L$ reaches the first threshold $i_{LIM1}$ at time $t_{B1}$. Like in the first scenario the discharge current $i_{REG}$ is set to the first current level which may be $i_{GS,on}$ so that the effective gate current $i_G$ becomes zero as explained above. However, in the second scenario the load current $i_L$, nevertheless, rises beyond the threshold $i_{LIM1}$ and reaches the second threshold $i_{LIM2}$ at time $t_{B2}$. When the load current it reaches the second threshold $i_{LIM2}$ at time $t_{B2}$ then the level of the discharge current $i_{REG}$ is set to a second current level. In the depicted embodiment the second current level equals $1.5 \cdot i_{GS,on}$. Accordingly, the superposition $i_{GS,on} - i_{REG}$ (i.e. the effective gate current) becomes $-0.5 \cdot i_{GS,on}$ and the gate of the power transistor is actively discharged with a relatively small current.

The reduction of the effective gate current is sufficient to achieve a reduction of the load current iL. When the load current $i_L$ falls below the second threshold $i_{LIM2}$ (or $i_{LIM2} - \Delta i_{hy2}$ if a hysteresis is used), the discharge current $i_{REG}$ is set again to the first current value, e.g. $i_{REG} = i_{GS,on}$ (see FIG. 3, time $t_{B3}$). When the load current in falls below the first threshold $i_{LIM1}$ (or $i_{LIM1} - \Delta i_{hy1}$ if a hysteresis is used), the discharge current $i_{REG}$ is set again to zero (see FIG. 3, time $t_{B4}$).

In the third scenario (starting at time $t_{C0}$) the discharge current $i_{REG}$ is again zero until the load current it reaches the first threshold $i_{LIM1}$ at time $t_{C1}$. Like in the second scenario, the discharge current $i_{REG}$ is set to the first current level, which may be $i_{GS,on}$ so that the effective gate current $i_G$ becomes zero as explained above. Subsequently, like in the second scenario the load current $i_L$ rises beyond the threshold $i_{LIM1}$ and reaches the second threshold $i_{LIM2}$ at time $t_{C2}$. At this time the level of the discharge current $i_{REG}$ is set to a second current level, which equals $1.5 \cdot i_{GS,on}$ in the present example. However, in the present example, the load current still rises further until it reaches the third threshold $i_{OC}$ at time $t_{C3}$. In response to the load current $i_L$ reaching the third threshold $i_{OC}$, the discharge current is set to a third current level denoted as $i_{OFF,fast}$, which is significantly higher than the "normal" gate current $i_{GS,on}$. The superposition $i_G = i_{GS,on} - i_{REG}$ now equals $i_{GS,on} - i_{OFF,fast}$, which is a negative current high enough (in magnitude) to discharge the gate very quickly, thereby forcing the load current to drop (after a small overshot) below the third threshold $i_{OC}$ (or $i_{OC} - \Delta i_{hy3}$ if a hysteresis is used), which happens at time $t_{C4}$ in the depicted example. At times $t_{C5}$ and $t_{C6}$ the current level of the discharge current is reset to the second current level (e.g. $i_{REG} = i_{GS,on}$) and, respectively, the first current level ($i_{REG} = 0$) as the load current further drops below the second threshold $i_{LIM2}$ and the first threshold $i_{LIM1}$, respectively.

As can be seen from the scenarios described above and depicted in FIG. 3, the current control circuit 15 is can change the discharge current $i_{REG}$ (and thus the effective gate current $i_{GS,on} = i_{REG}$) quasi-digitally by discrete steps as soon as the load current reaches certain thresholds. These thresholds $i_{LIM1}$, $i_{LIM2}$, and $i_{OC}$ may be configurable and thus may be adapted to a specific application.

Figure 2:
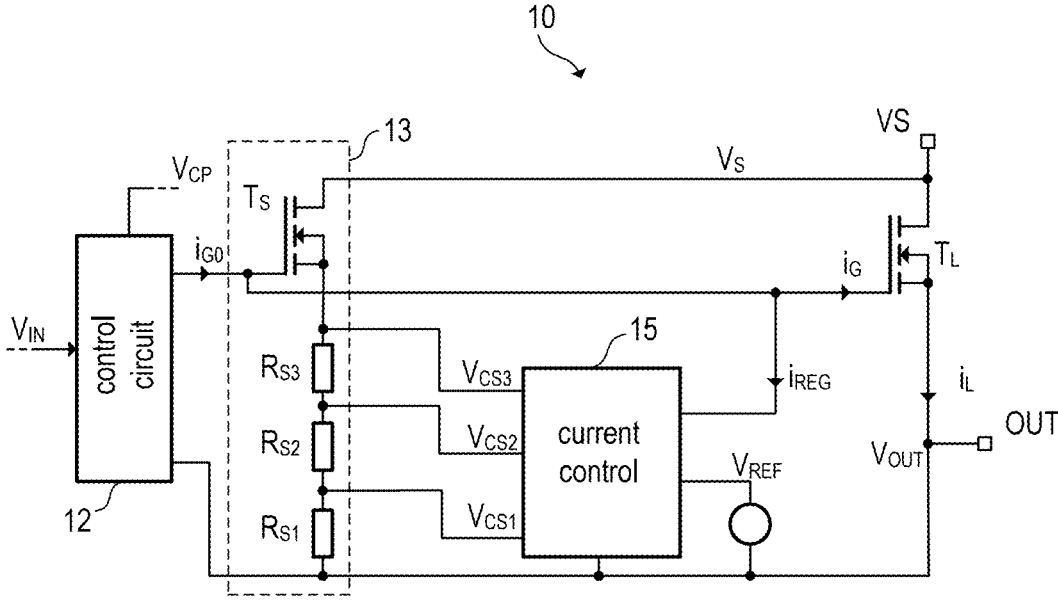
FIG. 2 illustrates a modification of the example of FIG. 1 in accordance with one embodiment.
Figure 4:
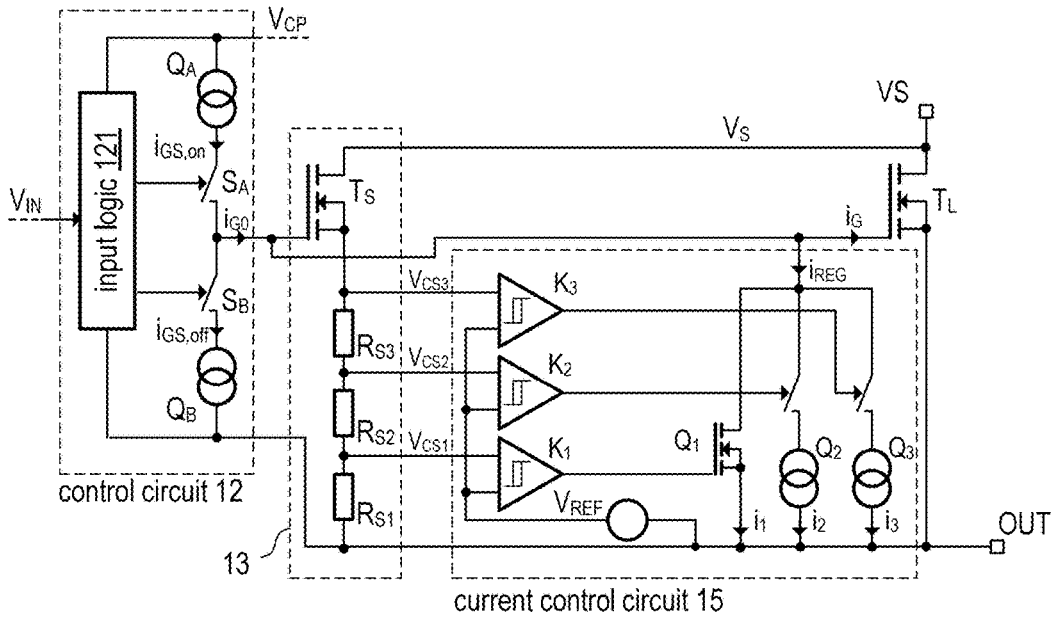
FIG. 4 illustrates one exemplary implementation of the circuit of FIG. 2 in more detail.

FIG. 4 illustrates a more detailed example similar to the circuit of FIG. 2. The power transistor $T_L$ and the current sense circuit 13 with the sense transistor $T_S$ are the same as in the previous example. The control circuit 12 includes an output stage composed of two current sources $Q_A$ and $Q_B$ that can be connected to the output node, which is coupled to the gate of the power transistor $T_L$, via electronic switches $S_A$ and $S_B$, respectively. The current source $Q_A$ outputs the current $i_{GS,on}$ which is output by the control circuit 12 when switch $S_A$ is closed (and switch $S_B$ is open) in order to charge the gate of power transistor $T_L$. Similarly, the current source $Q_B$ outputs the current $-i_{GS,off}$ which is sunk by the control circuit 12 when switch $S_B$ is closed (and switch $S_A$ is open) in order to discharge the gate of the power transistor $T_L$. The control circuit 12 further includes the input logic 121 which is configured to generate the control signals for the electronic switches $S_A$ and $S_B$ in accordance with the (e.g. level shifted) input signal $V_{IN}$. For example, if the input signal $V_{IN}$ has a High level (logical 1), then the input logic 121 may activate the switch $S_A$ and deactivate the switch $S_B$ to output the current $i_{GS,on}$. Conversely, if the input signal $V_{IN}$ has a Low level (logical 0), then the input logic 212 may activate the switch $S_B$ and deactivate the switch $S_A$ to output the current $i_{GS,off}$ at the output of the control circuit 12.

As can be seen from FIG. 4, the current source $Q_A$ is connected in series with the switch $S_A$ and arranged between an output node and a supply node at which the supply voltage $V_{CP}$ is provided. The current source $Q_B$ is connected in series with the switch $S_B$ and arranged between an output node and a reference node at which the voltage $V_{OUT}$ is provided (floating reference voltage). The current sources $Q_A$ and $Q_B$ may be implemented in any conventional manner. For example, the current sources $Q_A$ and $Q_B$ may be implemented using current mirrors wherein the currents $i_{GS,on}$ and $i_{GS,off}$ are derived from a single reference current, that may be provided by a constant current circuit.

The current control circuit 15 of FIG. 4 receives the three current sense signals $V_{CS3}$, $V_{CS2}$, and $V_{CS1}$ from the current sense circuit 13, which has already been discussed above with reference to FIG. 2. The three current sense signals $V_{CS3}$, $V_{CS2}$, and $V_{CS1}$ are supplied to a first input of comparators $K_3$, $K_2$, and $K_1$, respectively. The second inputs of these comparators receive the reference voltage $V_{REF}$. That is, comparator $K_3$ signals, at its output, whether the condition $V_{CS3} > V_{REF}$ is fulfilled (equivalent to $i_L > i_{LIM1}$), comparator $K_2$ signals, at its output, whether the condition $V_{CS2} > V_{REF}$ (equivalent to $i_L > i_{LIM2}$) is fulfilled, and comparator $K_1$ signals, at its output, whether the condition $V_{CS1} > V_{REF}$ (equivalent to $i_L > i_{OC}$) is fulfilled.

The current control circuit 15 includes a transistor $Q_1$ and current sources $Q_2$ and $Q_3$ which can be activated by the output signals of the comparators $K_1$, $K_2$, and $K_3$, respectively. The current sources $Q_2$ and $Q_3$ are activated and deactivated by switching the corresponding electronic switch $S_1$ and $S_2$ (connected in series to the respective current source) on and off, respectively. The current transistor $Q_1$ and the current sources $Q_2$ and $Q_3$ are connected in parallel so that the currents $i_1$, $i_2$, $i_3$ superpose at the output node at which the discharge current $i_{REG}$ is sunk from the gate of the power transistor $T_L$. That is, the discharge current $i_{REG}$ is equal to the sum of the currents $i_1$, $i_2$, and $i_3$ passing through the transistor $Q_1$, the current source $Q_2$, and the current source $Q_3$, respectively. In the present example, again four different scenarios can be distinguished.

First scenario: $i_L < i_{LIM1} < i_{LIM2} < i_{OC}$. If this condition is true, then all three sense voltages $V_{CS3}$, $V_{CS2}$, and $V_{CS1}$ are lower than the reference voltage $V_{REF}$ and the discharge current $i_{REG}$ is zero. The effective gate current $i_G = i_{GS,on} - i_{REG}$ equals to $i_{GS,on}$ and the power transistor is fully switched on (lowest on-resistance $R_{ON}$).

Second scenario: $i_L \geq i_{LIM1}$. If this condition is true, then the current sense voltage $V_{CS3}$ reaches or exceeds the reference voltage $V_{REF}$ ($V_{CS3} \geq V_{REF}$, $V_{CS2} < V_{REF}$, $V_{CS1} < V_{REF}$). As a consequence, the comparator $K_3$ activates the current source $Q_3$ while current source $Q_2$ and transistor $Q_1$ are still inactive. Accordingly, $i_{REG}$ equals $i_3$, wherein $i_{REG} = i_3 = i_{GS,on}$ in the present example. Thus, the discharge current $i_{REG}$ exactly compensates for the current $i_{GS,on}$ output by the control circuit 12 and the effective gate current $i_G = i_{GS,on} - i_{REG}$ equals to zero amperes.

Third scenario: $i_L \geq i_{LIM2}$. If this condition is true, then the current sense voltage $V_{CS2}$ reaches or exceeds the reference voltage $V_{REF}$ ($V_{CS3} \geq V_{REF}$, $V_{CS2} \geq V_{REF}$, $V_{CS1} < V_{REF}$). As a consequence, the comparator $K_2$ activates the current source $Q_2$ while current source $Q_3$ is also active but transistor $Q_1$ is still inactive. Accordingly, $i_{REG}$ equals $i_2 + i_3$, wherein $i_{REG} = i_2 + i_3 = 1.5 \cdot i_{GS,on}$ in the present example (i.e. $i_2 = 0.5 \cdot i_{GS,on}$). Thus, the discharge current $i_{REG}$ overcompensates for the current $i_{GS,on}$ output by the control circuit 12 and the effective gate current $i_G=i_{GS,on}-i_{REG}=0.5 \cdot i_{GS,on}$ is negative and the gate of the power transistor TL is actively discharged.

Fourth scenario: $i_L \geq i_{OC}$. If this condition is true, then the current sense voltage $V_{CS1}$ reaches or exceeds the reference voltage $V_{REF}$ ($V_{CS3} \geq V_{REF}$, $V_{CS2} \geq V_{REF}$, $V_{CS1} \geq V_{REF}$). As a consequence, the comparator $K_1$ activates the transistor $Q_1$ while current sources $Q_2$ and $Q_3$ are also active. Accordingly, $i_{REG}$ equals $i_1+i_2+i_3=i_{OFF,fast}$. As the transistor $Q_1$—when activated—provides a comparably low-ohmic current path between gate and source of the power transistor $T_L$ the resulting discharge current $i_{REG}=i_{OFF,fast}$ will quickly discharge the gate capacitance of the power transistor $T_L$. As a consequence, the resistance of the drain-source path of the power transistor $T_L$ will increase quickly to reduce the load current $i_L$.

The current sources $Q_2$ and $Q_3$ may be implemented in any common manner. For example, current mirrors may be used to derive the currents $i_2$ and $i_3$ from a reference current. This reference current may be same that is used by the control circuit 12 to generate the currents $i_{GS,on}$ and $i_{GS,off}$. At this point it should be emphasized that the circuit of FIG. 4 has to be regarded as an example for a circuit that behaves as it has been discussed above with reference to FIG. 2. It is clear from FIG. 4 that the same function can be implemented with only one current sense signal but three different reference voltages. Moreover, in some embodiments only two thresholds/current sense signals may be used, whereas in other embodiments four or more thresholds/current sense signals may be used.

In the above-mentioned second scenario ($i_L \geq i_{LIM1}$, $i_L < i_{LIM2}$), the discharge current $i_{REG}=i_{GS,on}$ compensates for the current $i_{GS,on}$ output by the control circuit 12 and, consequently, the effective gate current $i_G=i_{GS,on}-i_{REG}$ equals to zero amperes. For this special case, the circuit of FIG. 4 may be modified/improved in accordance with the embodiment shown in FIG. 5.

Figure 5:
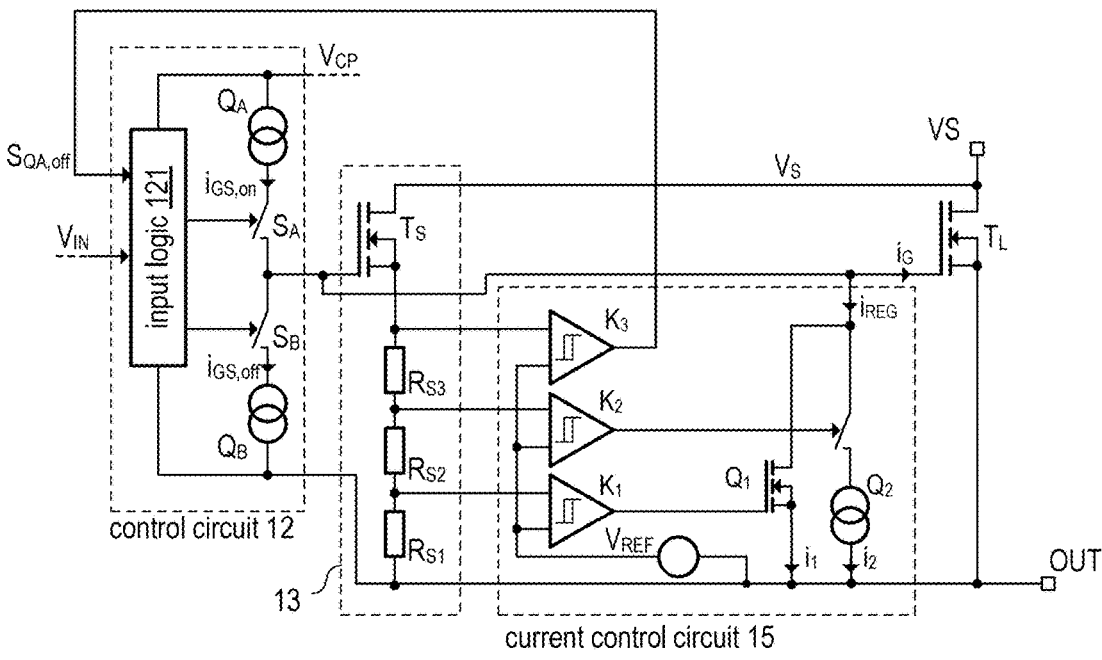
FIGS. 5 and 6 illustrate two exemplary modifications of the circuit of FIG. 4.

The circuit of FIG. 5 is mostly the same as the circuit of FIG. 4. Therefore, the following discussion concentrates on the difference between the two circuits. As compared to FIG. 4, the current source $Q_3$ and the corresponding switch $S_3$ are omitted in the current control circuit 15 of FIG. 5. Instead the output of comparator $K_3$ is supplied to the input logic 121 of the control circuit 12. The output signal of comparator $K_3$ is denoted as $S_{QA,off}$ in FIG. 5.

In the second scenario (i.e. when the condition $i_L \geq i_{LIM1}$ is fulfilled), the current sense voltage $V_{CS3}$ reaches or exceeds the reference voltage $V_{REF}$ ($V_{CS3} \geq V_{REF}$, $V_{CS2} < V_{REF}$, $V_{CS1} < V_{REF}$) and, as a consequence, the comparator $K_3$ outputs a High level (logic level $S_{QA,off}=1$) indicating the condition $i_L \geq i_{LIM1}$ being fulfilled. The signal $S_{QA,off}$ is received by the input logic 121, which is configured to switch off the electronic switch $S_A$ in response to a the signal $S_{QA,off}$ having a High level, and a switch-on of the electronic switch $S_A$ is prevented, by the input logic 121, as long as the signal $S_{QA,off}$ has a High level. The effect of the current sense voltage $V_{CS3}$ reaching the reference voltage $V_{REF}$ is the same as in the previous example of FIG. 4, namely, the effective gate current $i_G$ is reduced from $i_{GS,on}$ to zero amperes. However, the example of FIG. 5 has the advantage that there is no need for matched current sources, whereas, in FIG. 5, the current sources $Q_4$ and $Q_3$ have to be designed to generate exactly the same current $i_{GS,on}$ in order to achieve the mentioned compensation (i.e. to achieve that the superposition $i_{GS,on}-i_{REG}$ exactly equals zero).

It can be concluded from FIG. 5 that the current control circuit 15 may also be regarded as part of the control circuit 12 because an increase in the discharge current $i_{REG}$ is equivalent to a decrease of the current output by the control circuit 12. In particular. Increasing the discharge current $i_{REG}$ from zero to $i_{GS,on}$ is equivalent to reducing the output current of the control circuit 12 from $i_{GS,on}$ to zero (while keeping $i_{REG}$ at zero). In both cases the effective gate current $i_G$ is zero.

Figure 6:
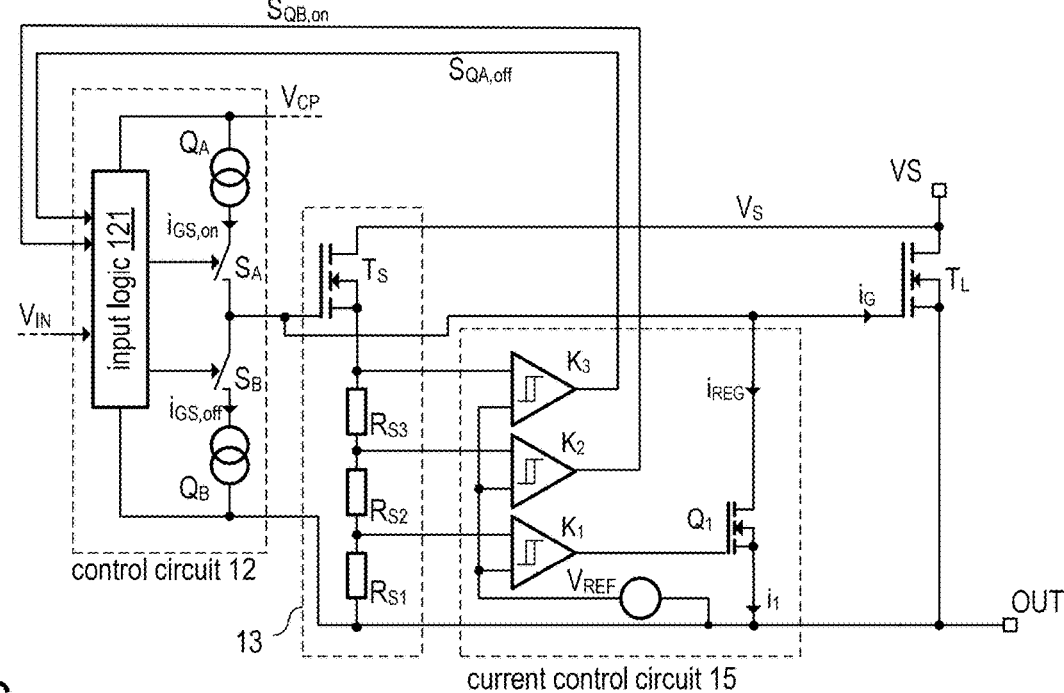

The circuit of FIG. 6 is very similar to the example of FIG. 5. Again, only the differences between these two circuits are discussed below. As compared to FIG. 6, the current source $Q_2$ and the corresponding switch $S_2$ are omitted in the current control circuit 15 of FIG. 6. Instead the output of comparator $K_2$ is supplied to the input logic 121 of the control circuit 12. The output signal of comparator $K_2$ is denoted as $S_{QB,on}$ in FIG. 6.

In the third scenario (i.e. when the condition $i_L \geq I_{LIM2}$ is fulfilled), the current sense voltage $V_{CS2}$ reaches or exceeds the reference voltage $V_{REF}$ ($V_{CS2} \geq V_{REF}$, $V_{CS3} \geq V_{REF}$, $V_{CS1} < V_{REF}$) and, as a consequence, the comparator $K_2$ outputs a High level (logic level $S_{QB,on}=1$) indicating the condition $i_L \geq I_{LIM2}$ being fulfilled. The signal $S_{QB,on}$ is received by the input logic 121, which is configured to switch on the electronic switch $S_B$ in response to the signal $S_{QB,on}$ having a High level. At the same time, the electronic switch $S_A$ is already off due to the signal $S_{QA,off}$ as discussed above with reference to FIG. 5. The effect of the current sense voltage $V_{CS2}$ reaching the reference voltage $V_{REF}$ is the same as in the previous example of FIG. 5 if $i_{GS,off}$ of current source $Q_B$ equals $i_2$ of current source $Q_2$. In both examples (FIGS. 5 and 6) the effective gate current $i_G$ equals $-i_2$ (if $i_2=i_{GS,off}$) in the third scenario.

Figure 7:
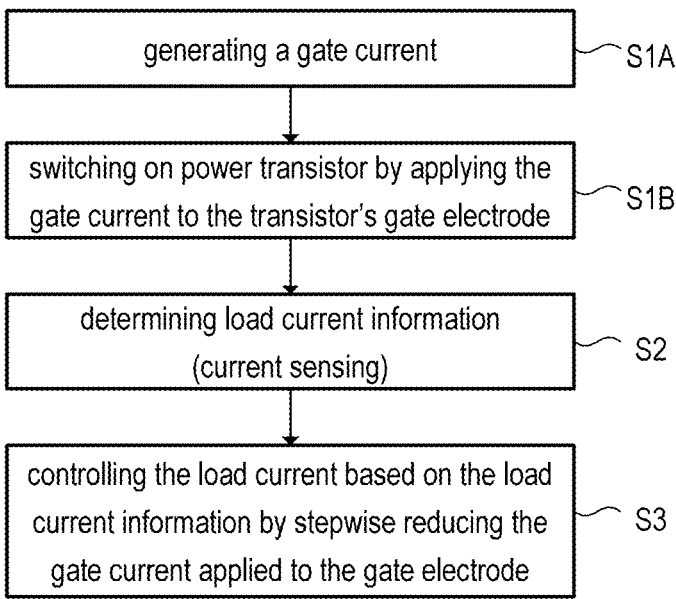
FIG. 7 is a flow chart illustrating one embodiment of a method which may be performed by the circuits.

The methods and functions implemented by the embodiments described above are now summarized with reference to the flow chart of FIG. 7. It is emphasized that the following is not an exhaustive listing of functions and method steps but rather an exemplary summary of technical features.

In accordance with one embodiment, the method includes the generation of a gate current (cf. FIG. 7, step S1A) and switching on a power transistor (cf. FIG. 7, step S1B) by applying the gate current $i_G=i_{G0}$ to the gate electrode of the power transistor (see, e.g., FIGS. 2, 4, and 5; control circuit 12 outputs the gate current $i_{G0}=i_{GS,on}$ when the input signal $V_{IN}$ indicates a switch-on). The method further includes determining information regarding a load current passing through the power transistor (cf. FIG. 7, step S2; see also, e.g., FIGS. 2, 4, and 5, current sense circuit 13). The mentioned information regarding the load current may be a current sense signal such as the voltage signals $V_{CS1}$, $V_{CS2}$, and $V_{CS3}$ discussed above with reference to FIGS. 2 and 4. Furthermore, the method includes controlling—based on the determined information regarding the load current—the load current by reducing the gate current $i_G$ applied to the gate electrode of the power transistor (cf. FIG. 7, step S3). The gate current $i_G$ is reduced in discrete steps as outlined in the following: When the load current exceeds a first threshold value $i_{LIM1}$ (which is indicated by the determine information regarding the load current), then the gate current $i_G$ is reduced by a specific (predetermined) amount, e.g. from $i_G=i_{G0}=i_{GS,on}$ to $i_G=0$. When the load current exceeds a further threshold value $i_{OC}$ (third threshold value in the example FIG. 3), then the gate current is reduced by sinking a discharge current from the gate electrode of the power transistor. In this situation, the level of the discharge current corresponds to a third current level (see, e.g., FIG. 3, $i_{REF}=i_{OFF,fast}$).

In one embodiment, the third current level ($i_{REG}=i_{OFF,fast}$) is so high that the power transistor is completely switched off. In some embodiments, the third current level is at least sufficiently high to reduce the gate voltage of the power transistor such that the load current falls below the third threshold value.

In some embodiments the reduction of the gate current is accomplished in three steps. For example, when the load current exceeds a second threshold value $i_{LIM2}$ (see, e.g. FIG. 3), then the gate current is reduced by setting the discharge current, which is sunk from the gate electrode, to a second current level. This second current level may be so high that the gate current becomes negative and the gate-source capacitance of the power transistor is actively discharged. The mentioned third threshold value $i_{OC}$ is greater than the second threshold value $i_{LIM2}$, and the second threshold value $i_{LIM2}$, is greater than the first threshold value $i_{LM1}$ (see, e.g., FIG. 3).

In the first step the reduction of the gate current may be accomplished in two ways. Accordingly, when the load current exceeds the first threshold value $i_{LM1}$, the gate current may be reduced by setting the discharge current, which is sunk from the gate electrode, to a first current level. If, this first current level is the same as the normal gate current uses to switch on the power transistor ($i_{REG}=i_{GS,on}$), the gate current is reduced to substantially zero. Alternatively, the control circuit that outputs the gate current to the gate electrode of the power transistor may reduce the gate current (e.g. to zero) without requiring a discharge current in this situation (see, e.g., FIG. 5, signal $S_{QA,off}$ causes the deactivation of the current source that provides the gate current $i_{GA,on}$). However, the discharge current is necessary when the gate electrode is to be actively discharged to reduce the load current of the power transistor.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. An integrated circuit comprising:
a power transistor connected between a supply terminal and an output terminal;
a control circuit coupled to a gate electrode of the power transistor and configured to apply a gate current to the gate electrode to turn the power transistor on or off;
a current sensing circuit configured to provide information regarding a load current passing through the power transistor; and
a current control circuit coupled to the gate electrode and configured to generate a discharge current for discharging the gate based on the information regarding the load current,
wherein a level of the discharge current corresponds to a first current level in response to the load current exceeding a first threshold value, wherein the level of the discharge current corresponds to a third current level in response to the load current exceeding a third threshold value,
wherein the level of the discharge current corresponds to a second current level in response to the load current exceeding a second threshold value, and
wherein the third current level is greater than the second current level and the second current level is greater than the first current level.

2. The integrated circuit according to claim 1,
wherein the third threshold value is greater than the second threshold value and the second threshold value is greater than the first threshold value.

3. The integrated circuit of claim 1,
wherein the third current level is so high that the transistor is completely switched off.

4. The integrated circuit of claim 1,
wherein the third current level is sufficiently high to reduce a gate voltage such that the load current falls below the third threshold value.

5. The integrated circuit according to claim 1,
wherein the current control circuit is configured to generate the discharge current for discharging the gate, while the control circuit drives the power transistor to turn it on or keep it on.

6. The integrated circuit according to claim 1,
wherein the current sense circuit comprises a sense transistor coupled to the power transistor, and
wherein the information regarding the load current is based on and amount of current passing through the sense transistor or is based on a voltage drop across at least one sense resistor coupled to the sense transistor.

7. The integrated circuit according to claim 1,
wherein the current control circuit comprises a plurality of comparators configured to compare a sensor signal representing the load current with at least the first threshold value and the third threshold value.

8. The integrated circuit of claim 7,
wherein the comparators have a hysteresis.

9. The integrated circuit according to claim 7,
wherein the discharge current generated by the current control circuit depends on output signals of the comparators.

10. An integrated circuit comprising:
a power transistor connected between a supply terminal and an output terminal;
a control circuit coupled to a gate electrode of the power transistor and configured to apply a gate current to the gate electrode to turn the power transistor on or off;
a current sensing circuit configured to provide information regarding a load current passing through the power transistor; and
a current control circuit coupled to the gate electrode and configured to generate a discharge current for discharging the gate based on the information regarding the load current and to cause the control circuit to reduce the gate current while the power transistor is switched on,
wherein the gate current output by the control circuit is reduced in response to the load current exceeding a first threshold value,
wherein a level of the discharge current is set to a third current level in response to the load current exceeding a third threshold value,
wherein the level of the discharge current is set to a second current level in response to the load current exceeding a second threshold value, and wherein the third current level is greater than the second current level and the second current level is greater than a load current level.

11. The integrated circuit of claim 10,
wherein the gate current output by the control circuit is reduced to zero in response to the load current exceeding the first threshold value.

12. A method comprising:
generating a gate current;
switching on a power transistor by applying the gate current to a gate electrode of the power transistor;
determining information regarding a load current passing through the power transistor; and
controlling, based on the information regarding the load current, the load current by reducing the gate current applied to the gate electrode of the power transistor;
wherein—in response to the load current exceeding a first threshold value—the gate current is reduced by a specific amount;
wherein—in response to the load current exceeding a third threshold value—the gate current is further reduced by sinking a discharge current, which has a third current level, from the gate electrode of the power transistor; and
wherein—in response to the load current exceeding a second threshold value—the gate current is reduced by setting the discharge current, which is sunk from the gate electrode, to a second current level.

13. The method of claim 12,
wherein the third current level is so high that the power transistor is completely switched off.

14. The method of claim 12,
wherein the third current level is sufficiently high to reduce a gate voltage such that the load current falls below the third threshold value.

15. The method of claim 12,
wherein the third threshold value is greater than the second threshold value and the second threshold value is greater than the first threshold value.

16. The method of claim 12,
wherein—in response to the load current exceeding the first threshold value—the gate current is reduced by setting the discharge current, which is sunk from the gate electrode, to a first current level.

17. The method of claim 12,
wherein—in response to the load current exceeding the first threshold value—the gate current is reduced to approximately zero.

18. An integrated circuit comprising:
a power transistor connected between a supply terminal and an output terminal;
a control circuit coupled to a gate electrode of the power transistor and configured to apply a gate current to the gate electrode to turn the power transistor on or off,
a current sensing circuit configured to provide information regarding a load current passing through the power transistor; and
a current control circuit coupled to the gate electrode and configured to generate a discharge current for discharging the gate based on the information regarding the load current,
wherein a level of the discharge current corresponds to a first current level in response to the load current exceeding a first threshold value,
wherein the level of the discharge current corresponds to a third current level in response to the load current exceeding a third threshold value, and
wherein the third current level is so high that the power transistor is completely switched off.

\* \* \* \* \*